(12) United States Patent
Zhou

(10) Patent No.: US 10,944,004 B2
(45) Date of Patent: Mar. 9, 2021

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/008,855

(22) Filed: Jun. 14, 2018

(65) Prior Publication Data

US 2018/0366580 A1 Dec. 20, 2018

(30) Foreign Application Priority Data

Jun. 16, 2017 (CN) .......................... 201710461421.8

(51) Int. Cl.
*H01L 29/78* (2006.01)
*H01L 29/66* (2006.01)
(Continued)

(52) U.S. Cl.
CPC .... *H01L 29/7848* (2013.01); *H01L 21/02529* (2013.01); *H01L 21/02532* (2013.01);
(Continued)

(58) Field of Classification Search
CPC ............... H01L 29/7848; H01L 29/785; H01L 29/1083; H01L 29/66628; H01L 29/66636; H01L 21/3065; H01L 21/02532; H01L 21/324; H01L 29/66545; H01L 21/76895; H01L 21/26506; H01L 21/02529; H01L 29/161; H01L 29/165; H01L 21/823821; H01L 29/66795; H01L 29/0603; H01L 29/0684; H01L 29/42356; H01L 29/66477; H01L 29/7843; H01L 29/7845
See application file for complete search history.

(56) References Cited

U.S. PATENT DOCUMENTS 9,985,134 B1 * 5/2018 Lin ..................... H01L 21/0214
2006/0194395 A1 * 8/2006 Ning ................... H01L 21/3081
438/286

(Continued)

FOREIGN PATENT DOCUMENTS

CN 103985634 A 8/2014

*Primary Examiner* — Su C Kim
(74) *Attorney, Agent, or Firm* — Anova Law Group, PLLC

(57) ABSTRACT

A semiconductor structure and a method for fabricating the semiconductor structure are provided. The method includes providing a base substrate, and forming a first stress layer in the base substrate. The method also includes forming a gate structure on the base substrate. The first stress layer in the base substrate is on both sides of the gate structure. In addition, the method includes after forming the gate structure, forming an opening in the first stress layer by back-etching the first stress layer. Further, the method includes forming a second stress layer in the opening of the first stress layer.

13 Claims, 8 Drawing Sheets

(51) Int. Cl.
*H01L 21/3065* (2006.01)
*H01L 21/02* (2006.01)
*H01L 21/324* (2006.01)
*H01L 21/768* (2006.01)
*H01L 21/265* (2006.01)
*H01L 29/10* (2006.01)
*H01L 29/161* (2006.01)
*H01L 29/165* (2006.01)

(52) U.S. Cl.
CPC .... *H01L 21/26506* (2013.01); *H01L 21/3065* (2013.01); *H01L 21/324* (2013.01); *H01L 21/76895* (2013.01); *H01L 29/1083* (2013.01); *H01L 29/66545* (2013.01); *H01L 29/66628* (2013.01); *H01L 29/66636* (2013.01); *H01L 29/785* (2013.01); *H01L 29/161* (2013.01); *H01L 29/165* (2013.01)

(56) References Cited

U.S. PATENT DOCUMENTS

| | | | |
|---|---|---|---|
| 2012/0112208 A1 | 5/2012 | Adam et al. | |
| 2012/0181625 A1* | 7/2012 | Kwok | H01L 29/7848 257/408 |
| 2013/0092954 A1* | 4/2013 | Yang | H01L 29/6656 257/77 |
| 2016/0020301 A1* | 1/2016 | Park | H01L 29/66795 257/283 |
| 2016/0163702 A1* | 6/2016 | Wu | H01L 27/0922 257/369 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710461421.8, filed on Jun. 16, 2017, the entirety of which is incorporated herein by reference.

FIELD OF THE DISCLOSURE

The present disclosure generally relates to the field of semiconductor technology and, more particularly, relates to a semiconductor structure and fabrication method thereof.

BACKGROUND

With the rapid development of semiconductor manufacturing technology, semiconductor devices have been developed toward with higher component density and higher integration degree. Transistors, as the most basic semiconductor devices, have been widely used. With the increasing of the component density and the integration degree of the semiconductor devices, gate dimensions of a planar transistor are scaled down, and the control capability of the gate-to-channel current of the planar transistor becomes weak, leading to a short-channel effect and causing a leakage current issue, thus, affecting the electrical properties of the semiconductor devices.

To overcome the short-channel effect of the transistor and to suppress the leakage current, fin field effect transistors (FinFET) have been developed. A FinFET is one of common multi-gate devices. In the FinFET, the gate electrode can control the fin from at least two sides. Thus, the FinFET has a much stronger gate-to-channel control capability than the planar device, and can well suppress the short-channel effect. Compared to other devices, the FinFET has better compatibility with existing integrated circuit (IC) fabrication processes.

In addition, carrier mobility is one of the main factors that affect the performance of the transistor. Effectively increasing the carrier mobility has become one of focuses of the transistor device manufacturing process. Because stress can change an energy gap and the carrier mobility of a silicon material, the performance of the transistor is commonly improved by forming a stress layer. For example, a stress layer capable of providing tensile stress is formed in an N-type transistor to increase electron mobility, and a stress layer capable of providing compressive stress is formed in a P-type transistor to increase hole mobility.

However, even after using the stress layer, the performance of the semiconductor structure still needs to be improved. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a base substrate, and forming a first stress layer in the base substrate. The method also includes forming a gate structure on the base substrate. The first stress layer in the base substrate is on both sides of the gate structure. In addition, the method includes after forming the gate structure, forming an opening in the first stress layer by back-etching the first stress layer. Further, the method includes forming a second stress layer in the opening of the first stress layer.

Another aspect of the present disclosure includes a semiconductor structure. The semiconductor structure includes a gate structure on a base substrate, and a first stress layer in the base substrate on both sides of the gate structure. The semiconductor structure also includes a second stress layer in the first stress layer and surrounded by the first stress layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
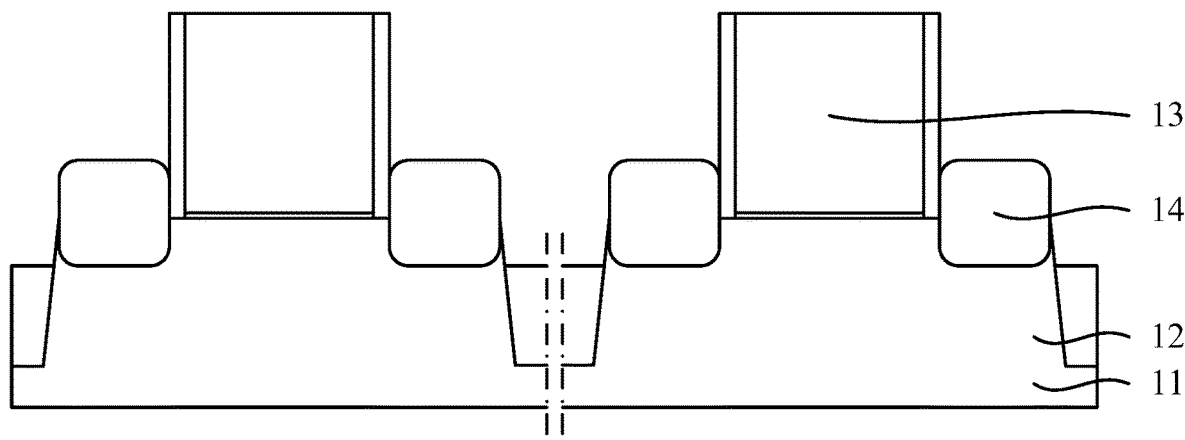
FIGS. 1-2 illustrate semiconductor structures corresponding to certain stages for forming a semiconductor structure.
Figure 2:
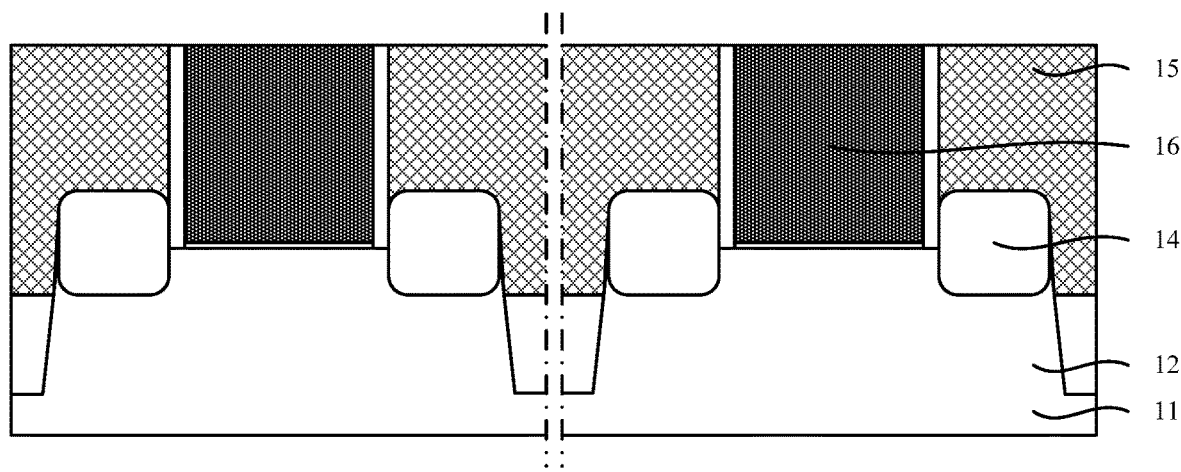

FIGS. 1-2 illustrate semiconductor structures corresponding to certain stages for forming the semiconductor structure. Referring to FIG. 1, a substrate 11 is provided, and a plurality of discrete fins 12 are formed on the substrate 11. A gate structure 13 is formed on the fin 12, and the gate structure 13 is across a length portion of the fin 12 and covers a portion of each of a top surface and a sidewall of the fin 12. A stress layer 14 is formed in the fins 12 on both sides of the gate structure 13. An ion implantation process is performed on the stress layer 14 by an in-situ self-doping method.

To improve the performance of the formed semiconductor structure, a metal gate structure is used in the semiconductor structure. Therefore, the gate structure 13 is a dummy gate structure. As shown in FIG. 2, after forming the stress layer 14, an interlayer dielectric layer 15 is formed on the substrate 11. The interlayer dielectric layer 15 exposes the dummy gate structure. The dummy gate structure is removed to form a gate opening (not illustrated) in the interlayer dielectric layer 15. A metal gate structure 16 is formed in the gate opening.

The activation of doping ions in the stress layer 14 and the formation of the metal gate structure 16 are accompanied by the use of many thermal processes. Therefore, a thermal budget of the subsequent processes after forming the stress layer 14 is high. The high thermal budget will cause the stress layer 14 a stress-released issue, and affect the performance of the formed semiconductor structure.

Moreover, as the size of the device decreases, the size of the stress layer 14 keeps decreasing. To reduce a contact resistance between the stress layer 14 and a subsequently formed plug, a doping concentration of the stress layer 14 keeps increasing. The increasing of the doping concentration of the stress layer 14 will enhance the short-channel effect of the formed semiconductor structure, and, thus, affect the performance of the formed semiconductor structure.

In addition, the reduction of the size of the stress layer 14 will cause the stress layer 14 to reduce the stress applied on the channel of the formed semiconductor structure. Therefore, the mobility of carriers in the channel decreases, and the performance of the formed semiconductor structure degrades.

The present disclosure provides a semiconductor structure and fabrication method of the semiconductor structure. A first stress layer and a second stress layer may be formed before and after forming a gate structure, respectively. The first stress layer and the second stress layer may form a source and drain doped region of the semiconductor structure. The second stress layer may be formed after forming the gate structure, thereby the influence of the formation process of the gate structure on the second stress layer may be reduced, and the probability of the occurrence of a stress-released issue in the second stress layer may be effectively reduced, facilitating improving the performance of the formed semiconductor structure.

Figure 17:
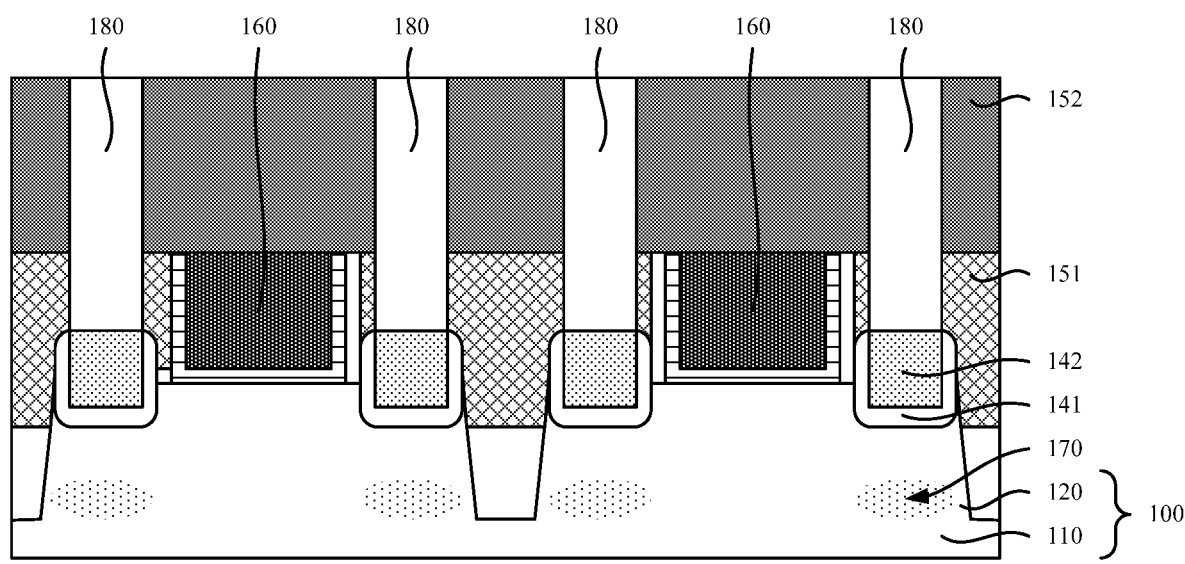
Figure 18:
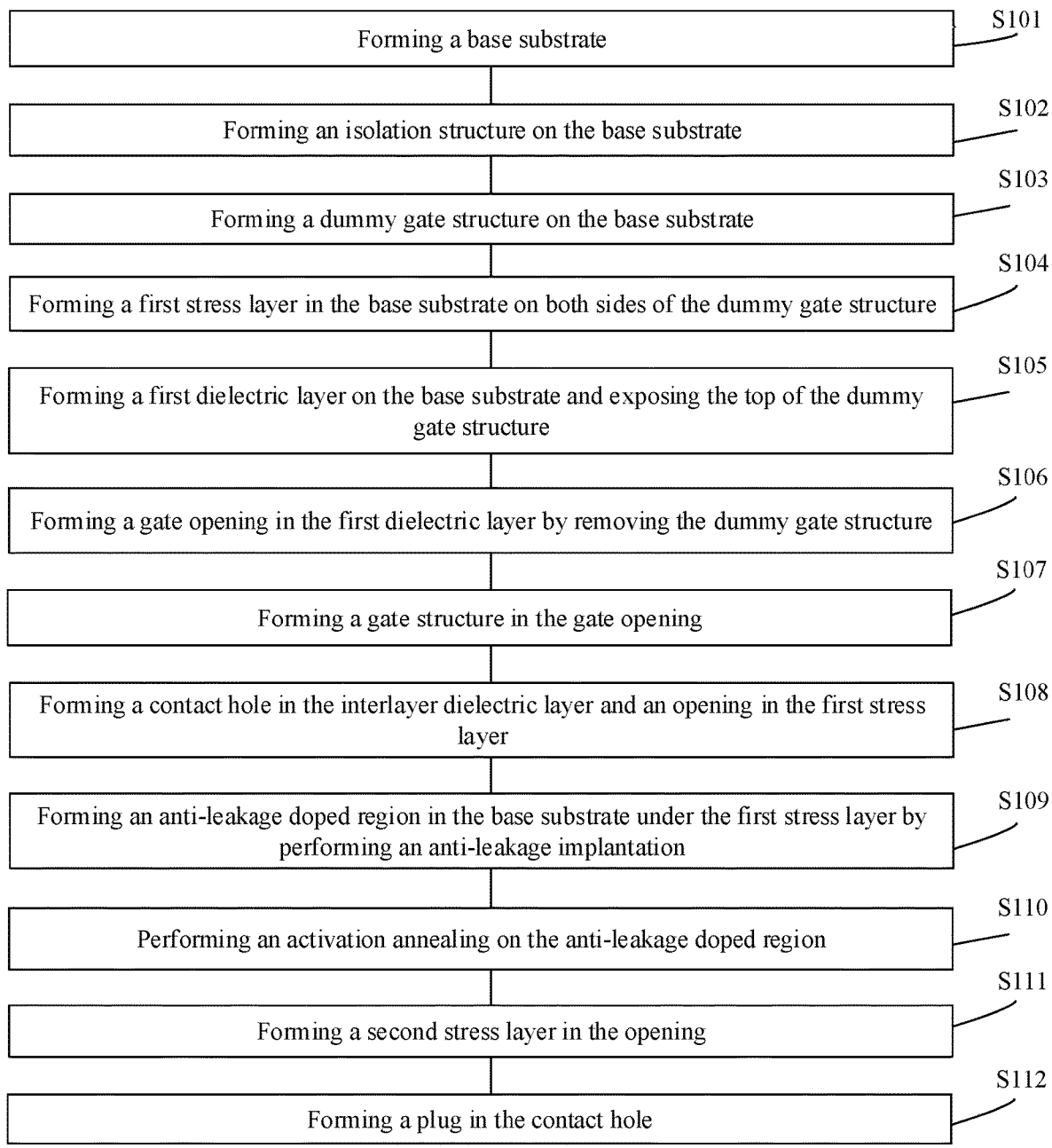
FIG. 18 illustrates an exemplary fabrication method for forming a semiconductor structure consistent with various disclosed embodiments of the present disclosure.

FIG. 18 illustrates an exemplary fabrication method for forming a semiconductor structure consistent with various disclosed embodiments of the present disclosure; and FIGS. 3-17 illustrate semiconductor structures corresponding to certain stages of the exemplary fabrication method.

Referring to FIGS. 3-11, a base substrate 100 may be formed, and a gate structure 160 (illustrated in FIG. 11) may be formed on the base substrate 100. A first stress layer 141 (illustrated in FIG. 11) may be formed in the base substrate 100 on both sides of the gate structure 160.

Figure 3:
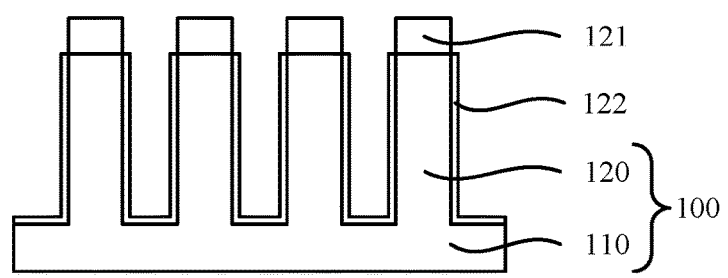
FIGS. 3-17 illustrate semiconductor structures corresponding to certain stages for forming an exemplary semiconductor structure consistent with various disclosed embodiments of the present disclosure.

As shown in FIG. 18, at the beginning of the fabrication method, a base substrate with certain structures may be formed (S101). FIG. 3 illustrates a corresponding semiconductor structure.

Referring to FIG. 3, a base substrate 100 may be formed. The base substrate 100 may provide an operation platform for subsequent processes. In one embodiment, the formed semiconductor structure may include a fin structure, and the base substrate 100 may include a substrate 110 and a plurality of discrete fins 120 on the substrate 110. In another embodiment, the formed semiconductor structure may include a planar structure, and the base substrate may include a planar substrate. The substrate 110 may provide an operation platform for subsequent processes. A channel of the formed semiconductor structure may be located in the fin 120.

In one embodiment, the substrate 110 may be made of monocrystalline silicon. In another embodiment, the substrate may be made of polysilicon, amorphous silicon, amorphous germanium, germanium, silicon germanium, silicon carbide, gallium arsenide, or indium gallium, etc. In certain embodiments, the substrate may be made of a silicon on insulator (SOI) substrate, a germanium on insulator (GOI) substrate, a glass substrate, and other types of substrates. The substrate may be made of materials adapted to process requirements and easy integration.

In one embodiment, the fin 120 may be made of a same material as the substrate 110. Both the fin 120 and the substrate 110 may be made of monocrystalline silicon. In another embodiment, the fin may be made of a material different from the substrate. The fin may be made of amorphous germanium, germanium, silicon germanium, silicon carbide, gallium arsenide, or indium gallium, etc.

In one embodiment, the substrate 110 and the fin 120 may be formed at the same time. Forming the substrate 110 and the fin 120 may include: providing an initial substrate; forming a patterned fin mask layer 121 on a surface of the initial substrate; and etching the initial substrate using the fin mask layer 121 as a mask to remove portions of the initial substrate, thereby the substrate 110 and the fin 120 protruding on the substrate 110 may be formed. In one embodiment, after forming the substrate 110 and the fin 120, the fin mask layer 121 may be retained to protect a top of the fin 120. In another embodiment, after forming the substrate and the fin, the fin mask layer may be removed to expose the top of the fin.

When forming the substrate 110 and the fin 120, damages or minor roughness may occur on the surface of the substrate 110 and the sidewall of the fin 120. To improve the performance of the semiconductor structure, in one embodiment, a liner oxide layer 122 may be formed on the surface of the substrate 110 and the sidewall of the fin 120. The liner oxide layer 122 may smooth sharp corners on the surface of the substrate 110 and the sidewall of the fin 120, and act as a buffer layer between the subsequently formed film layer and the substrate 110 and the fin 120 to reduce the lattice mismatch thereof. For example, the liner oxide layer 122 may be formed by a chemical vapor deposition process, or a thermal oxidation process, etc. In certain embodiments, the liner oxide layer may not be formed. The damages may be repaired by performing an annealing process on the substrate 110 and the fin 120.

Figure 4:
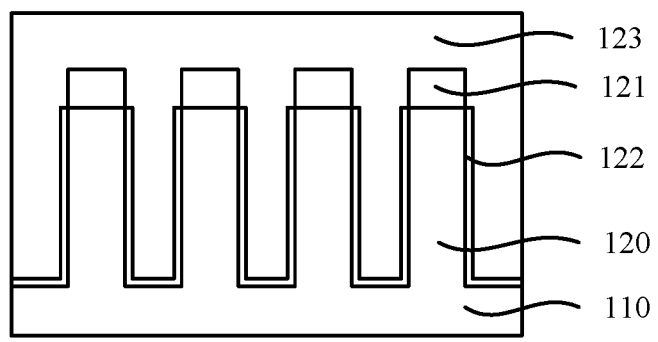
Figure 5:
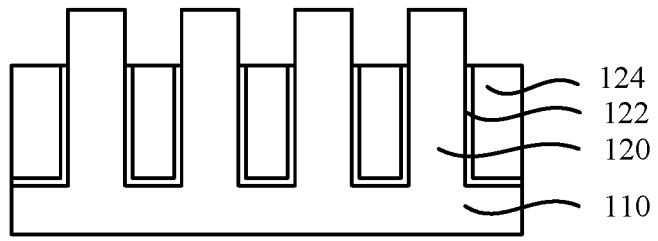

Returning to FIG. 18, after forming the base substrate, an isolation layer may be formed (S102). FIGS. 4-5 illustrate corresponding semiconductor structures.

Referring to FIG. 5, an isolation layer 124 may be formed to fill a gap between adjacent fins 120. The isolation layer 124 may cover a portion of the sidewall of the fin 120, and a top of the isolation layer 124 may be lower than the top of the fin 120. The isolation layer, as an isolation structure of the semiconductor structure, may electrically isolate adjacent devices and the adjacent fins. The isolation layer 124 may be formed on the substrate 110 exposed by the fin 120, and a height of the isolation layer 124 may be lower than a height of the fin 120. In one embodiment, the isolation layer may be made of silicon oxide. In another embodiment, the isolation layer may be made of silicon nitride, silicon oxynitride, or other suitable insulating material(s).

In one embodiment, forming the isolation layer 124 may include: forming an isolation material layer 123 (illustrated in FIG. 4) on the substrate 110 exposed by the fin 120, where the isolation material layer 123 may cover the top of the fin 120; removing the isolation material layer 123 above the top of the fin 120 by polishing; and removing a portion of the remaining isolation material layer along a thickness direction of the isolation material layer by back-etching to expose the top and a portion of the sidewall of the fin 120, thereby the isolation layer 124 may be formed. When the fin mask layer 121 (illustrated in FIG. 3) is retained after forming the substrate 110 and the fin 120, the fin mask layer 121 may protect the top of the fin 120 during the back-etching process. After forming the isolation layer 124, the fin mask layer 121 may be removed to expose the top of the fin 120.

The gate structure 160 may be a gate structure of the formed semiconductor structure, and may be used to control turned-on and turned-off of the channel of the formed semiconductor structure. The first stress layer 141 may be used as a portion of a source and drain doped region of the formed semiconductor structure, and may provide stress on the channel of the formed semiconductor structure to increase mobility of carriers in the channel.

In one embodiment, the formed semiconductor structure may include a metal gate structure. That is, the gate structure 160 may be a metal gate structure. The gate structure 160 may include a gate dielectric layer and a metal gate electrode. In another embodiment, the gate structure may be a polysilicon gate structure or other gate structures.

In one embodiment, referring to FIGS. 6-11, forming the first stress layer 141 (illustrated in FIG. 8) and the gate structure 160 (illustrated in FIG. 11) may include forming a dummy gate structure 130 on the base substrate 100 after forming the base substrate 100; forming the first stress layer 141 in the base substrate 100 on both sides of the dummy gate structure 130; forming a first dielectric layer 151 after forming the first stress layer 141, where the first dielectric layer 151 may expose the dummy gate structure 130; forming a gate opening 161 (illustrated in FIG. 10) in the first dielectric layer 151 by removing the dummy gate structure 130 (illustrated in FIG. 9), and forming the metal gate structure (illustrated in FIG. 11) in the gate opening 161.

Figure 6:
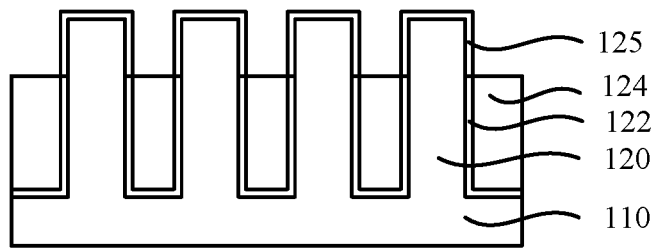
Figure 7:
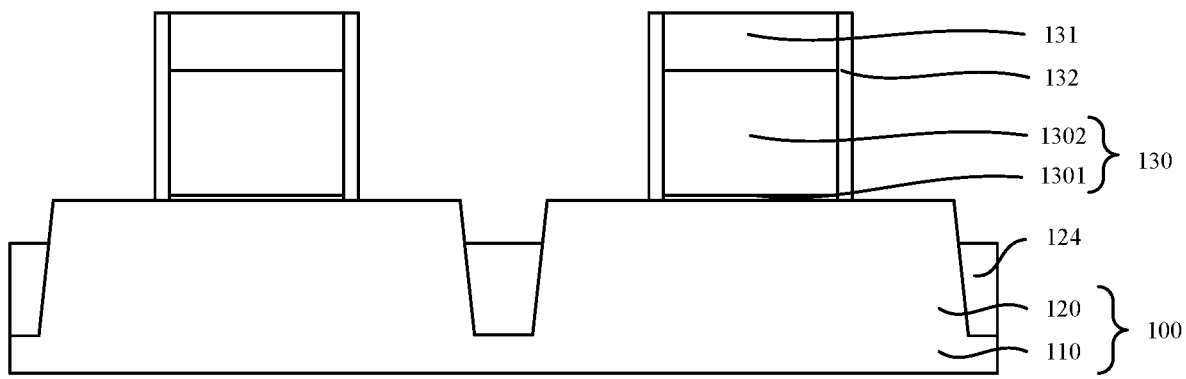

Returning to FIG. 18, after forming the isolation layer, a dummy gate structure may be formed (S103). FIGS. 6-7 illustrate corresponding semiconductor structures.

Referring to FIG. 7, a dummy gate structure 130 may be formed on the base substrate 100. The dummy gate structure 130 may occupy a space for subsequently forming a metal gate structure. In one embodiment, the base substrate 100 may include the substrate 110 and the fin 120. Therefore, the dummy gate structure 130 may be across a length portion of the fin 120 and cover a portion of each of the top surface and the sidewall of the fin 120.

In one embodiment, the dummy gate structure 130 may be a stacked-layer structure. The dummy gate structure 130 may include a dummy oxide layer 1301 and a dummy gate layer 1302 on the dummy oxide layer 1301. In another embodiment, the dummy gate structure may be a single-layer structure. Correspondingly, the dummy gate structure may include the dummy gate layer.

In one embodiment, the dummy oxide layer 1301 may be made of silicon oxide. In another embodiment, the dummy oxide layer may be made of silicon oxynitride. In one embodiment, the dummy gate layer 1302 may be made of polysilicon. In another embodiment, the dummy gate layer may be made of silicon oxide, silicon nitride, silicon oxynitride, silicon carbide, silicon carbonitride, silicon oxycarbonitride, or amorphous carbon, etc.

In one embodiment, forming the dummy gate structure 130 may include: forming an oxide material layer 125 (illustrated in FIG. 6) on the surface of the fin 120 exposed by the isolation layer 124; forming a dummy gate material layer (not illustrated) on the oxide material layer 125; forming a patterned gate mask 131 on a surface of the dummy gate material layer; and etching the dummy gate material layer until the oxide material layer 125 is exposed by using the patterned gate mask 131 as a mask to form the dummy gate layer 1302 on the oxide material layer 125. The dummy gate layer 1302 may be across the length portion of the fin 120 and cover a portion of each of the top surface and the sidewall of the fin 120. Forming the dummy gate structure 130 may also include removing the oxide material layer 125 exposed by the dummy gate layer 1302 to expose the surface of the fin 120. The remaining oxide material layer 125 covered by the dummy gate layer 1302 may be used as the dummy oxide layer 1301. The dummy oxide layer 1301 may be across the length portion of the fin 120 and cover a portion of each of the top surface and the sidewall of the fin 120.

In one embodiment, after forming the dummy gate structure 130, the gate mask 131 on the top of the dummy gate structure 130 may be retained. In one embodiment, the gate mask 131 may be made of silicon nitride. In another embodiment, the gate mask 131 may be made of silicon oxynitride, silicon carbide, or boron nitride, etc. The gate mask 131 may protect the top of the dummy gate structure 130 during subsequent processes.

After forming the dummy gate structure 130, a sidewall spacer 132 may be formed on the sidewall of the dummy gate structure 130. The sidewall spacer 132 may protect the dummy gate structure 130 and define a position of a subsequently formed source and drain doped region. The sidewall spacer 132 may be made of silicon oxide, silicon nitride, silicon carbide, silicon carbonitride, silicon oxycarbonitride, silicon oxynitride, boron nitride, or boron carbonitride, etc. The sidewall spacer may be a single-layer structure, or a stacked-layer structure. In one embodiment, the sidewall spacer 132 may be a single-layer structure, and may be made of silicon nitride.

Figure 8:
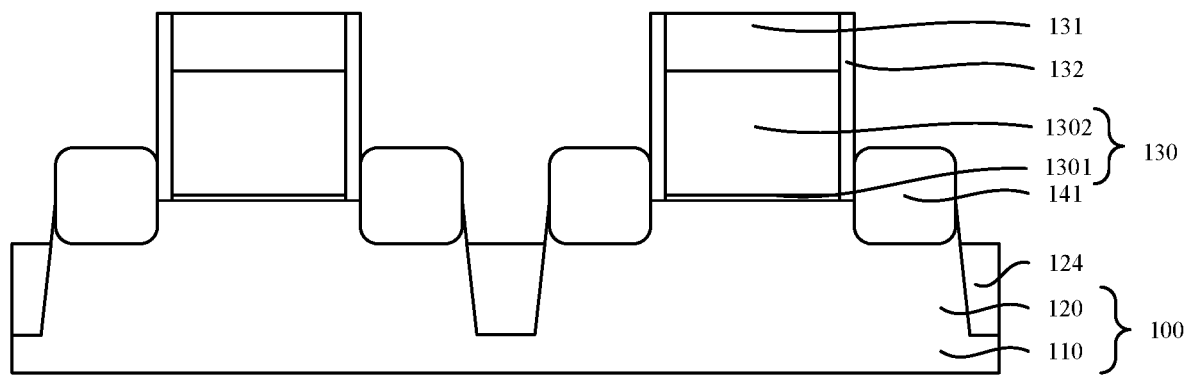

Returning to FIG. 18, after forming the dummy gate structure, a first stress layer may be formed (S104). FIG. 8 illustrates a corresponding semiconductor structure.

Referring to FIG. 8, a first stress layer 141 may be formed in the base substrate 100 on both sides of the dummy gate structure 130. The first stress layer 141 may be used as a portion of the source and drain doped region of the formed semiconductor structure.

In one embodiment, the formed semiconductor structure may be used to form an NMOS device, thus, the stress layer 141 may be an N-type doped stress layer. The first stress layer 141 may be made of N-type doped silicon carbon or silicon. The dopant ions in the first stress layer 141 may be N-type ions, such as P, As, or Sb, etc.

In certain embodiments, the formed semiconductor structure may be used to form a PMOS device, or a CMOS device. When the formed semiconductor structure is used to form a PMOS device, the first stress layer may be made of P-type doped silicon germanium or silicon. The dopant ions in the first stress layer may be P-type ions, such as B, Ga, or In, etc. When the formed semiconductor structure is used to form a CMOS device, the material and doped type of the first stress layer may be different according to different types of the semiconductor structure.

In one embodiment, the base substrate 100 may include the substrate 110 and the fin 120. The first stress layer 141 may be formed in the fin 120 on both sides of the dummy gate structure 130. Therefore, forming the first stress layer 141 may include forming the first stress layer 141 in the fin 120 on both sides of the dummy gate structure 130.

To increase the effect of the first stress layer 141 exerting stress on the channel of the formed semiconductor structure, in one embodiment, the first stress layer 141 may be disposed adjacent to the dummy gate structure 130. In one embodiment, the sidewall spacer 132 may be formed on the sidewall of the dummy gate structure 130, such that the first stress layer 141 may be in contact with the sidewall spacer 132.

In one embodiment, forming the first stress layer 141 may include forming openings (not illustrated) in the fin 120 on both sides of the dummy gate structure 130; and forming the first stress layer 141 in the openings by an epitaxial growth process, where an in-situ self-doping may be performed during the epitaxial growth of the first stress layer 141.

In one embodiment, the formed semiconductor structure may be used to form an NMOS device, the in-situ self-doped dopant ions may be P ions, and a doping concentration may be in a range of approximately $8.0 \times 10^{20}$ atoms/cm$^3$-$2.5 \times 10^{21}$ atoms/cm$^3$. In another embodiment, the formed semiconductor structure may be used to form a PMOS device, and the in-situ self-doped dopant ions may be B ions, and a doping concentration may be in a range of approximately $2.0 \times 10^{20}$ atoms/cm$^3$-$1.5 \times 10^{21}$ atoms/cm$^3$.

Figure 9:
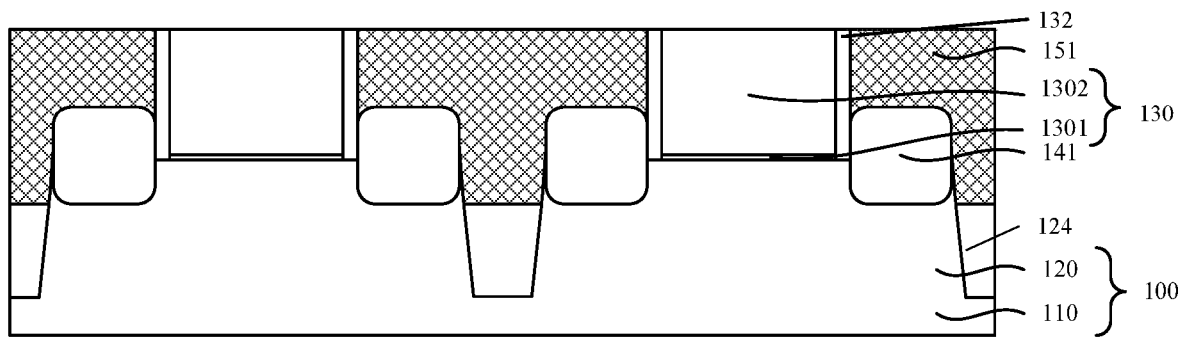

Returning to FIG. 18, after forming the first stress layer, a first dielectric layer may be formed (S105). FIG. 9 illustrates a corresponding semiconductor structure.

Referring to FIG. 9, after forming the first stress layer, a first dielectric layer 151 may be formed on the base substrate 100. The first dielectric layer 151 may expose the top of the dummy gate structure 130. The first dielectric layer 151, as a portion of an interlayer dielectric layer, may electrically isolate adjacent semiconductor structures.

In one embodiment, the first dielectric layer 151 may be made of silicon oxide. In another embodiment, the first dielectric layer 151 may be made of silicon nitride, silicon oxynitride, or other suitable insulating material(s).

Forming the first dielectric layer 151 may include: forming a dielectric material layer (not illustrated) on the substrate 110 exposed by the dummy gate structure 130, where the dielectric material layer may cover the dummy gate structure 130; removing the dielectric material layer above the dummy gate structure 130 by polishing, thereby the first dielectric layer 151 may be formed; and removing the gate mask 131 to expose the top of the dummy gate structure 130.

Figure 10:
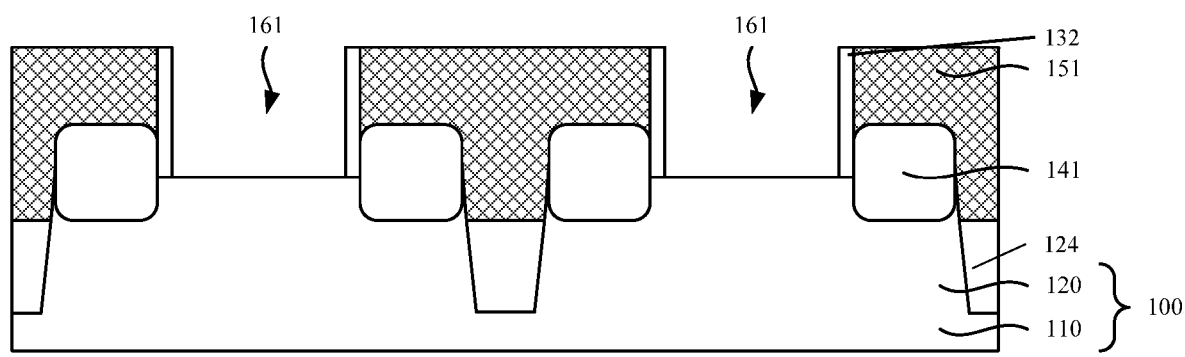

Returning to FIG. 18, after forming the first dielectric layer, a gate opening may be formed (S106). FIG. 10 illustrates a corresponding semiconductor structure.

Referring to FIG. 10, a gate opening 161 may be formed in the first dielectric layer 151 by removing the dummy gate structure 130 (illustrated in FIG. 9). The gate opening 161 may provide a process space for the formation of a metal gate structure.

In one embodiment, the base substrate 100 may include the substrate 110 and the fin 120. The dummy gate structure 130 may be across the length portion of the fin 120 and cover a portion of each of the top surface and the sidewall of the fin 120. Therefore, a bottom of the gate opening 161 may expose a portion of each of the top surface and the sidewall of the fin 120.

Figure 11:
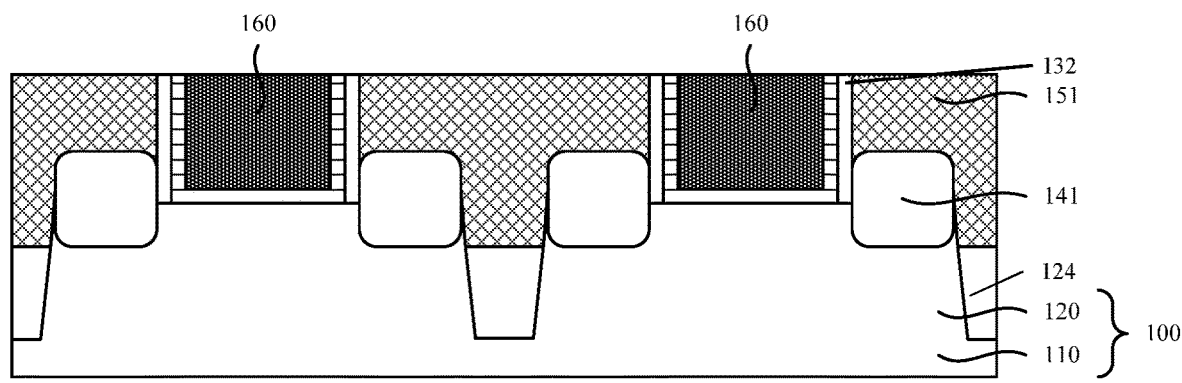

Returning to FIG. 18, after forming the gate opening, a gate structure may be formed (S107). FIG. 11 illustrates a corresponding semiconductor structure.

Referring to FIG. 11, a gate structure 160 may be formed in the gate opening 161 (illustrated in FIG. 10). The gate structure 160 may include a gate dielectric layer (not illustrated) and a metal gate electrode (not illustrated) on the gate dielectric layer. Forming the gate structure 160 in the gate opening 161 may include: forming the gate dielectric layer on the base substrate 100 exposed at the bottom of the gate opening 161, and forming the metal gate electrode on the gate dielectric layer.

The gate dielectric layer may electrically isolate the gate structure 160 and the channel in the base substrate 100. The gate dielectric layer may be made of a high-K dielectric material, where the high-K dielectric material may be referred to a dielectric material having a relative dielectric constant greater than silicon oxide. In one embodiment, the gate dielectric layer may be made of HfO$_2$. In certain embodiments, the gate dielectric layer may be made of ZrO$_2$, HfSiO, HfSiON, HfTaO, HfTiO, HfZrO, or Al$_2$O$_3$, etc.

In one embodiment, the bottom of the gate opening 161 may exposes a portion of each of the top surface and the sidewall of the fin 120. The gate dielectric layer may be across the length portion of the fin 120 and on a portion of each of the top surface and the sidewall of the fin 120.

The gate dielectric layer may be formed by an atomic layer deposition process. In certain embodiments, the gate dielectric layer may be formed by a chemical vapor deposition process, a physical vapor deposition process, or other film deposition processes.

The metal gate electrode may be configured as an electrode to achieve electrical connection to an external circuit. In one embodiment, the metal gate electrode may be made of W. In certain embodiments, the metal gate electrode may be made of Al, Cu, Ag, Au, Pt, Ni, or Ti, etc.

In the disclosed embodiments, a high-K last metal gate last process sequence is described for illustrative purposes. In certain embodiments, a high-K first metal gate last process sequence, or a high-K first metal gate first process sequence may be used.

Figure 12:
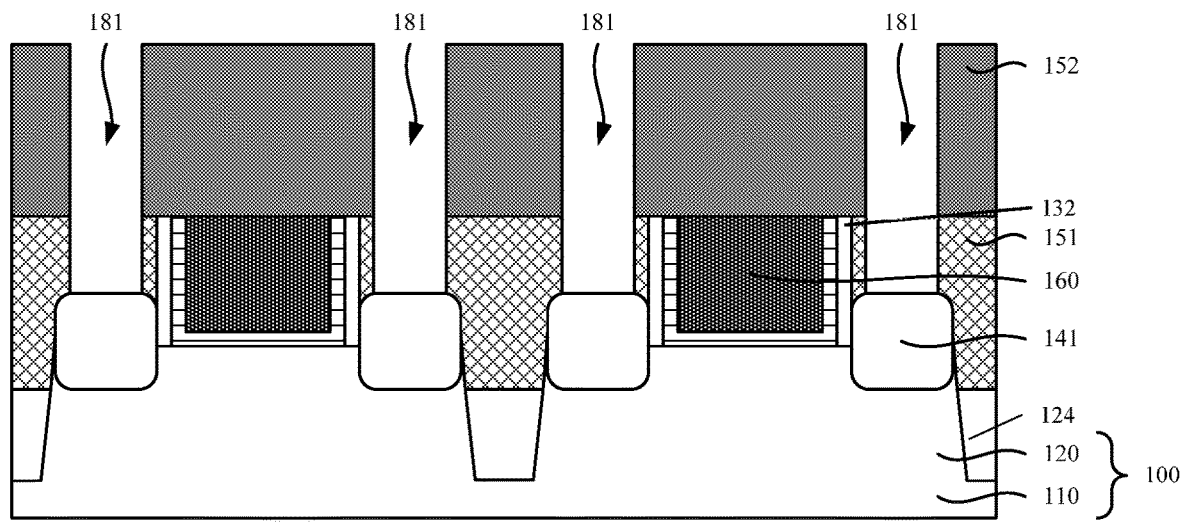
Figure 13:
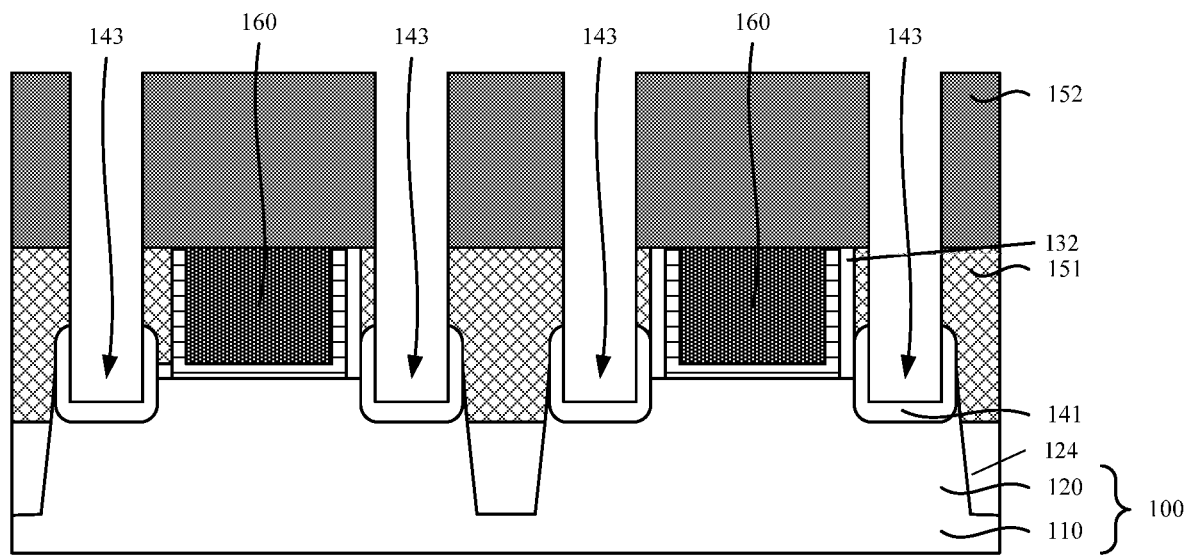

Returning to FIG. 18, after forming the gate structure, an opening in the first stress layer may be formed (S108). FIGS. 12-13 illustrate corresponding semiconductor structures.

Referring to FIG. 13, after forming the gate structure 160, an opening 143 may be formed in the first stress layer 141 by back-etching the first stress layer 141.

In one embodiment, an interlayer dielectric layer may be formed on the base substrate 100. Therefore, referring to FIG. 12, before performing the back-etching process, a second dielectric layer 152 may be formed on the first dielectric layer 151. The second dielectric layer 152 may cover the gate structure 160. The second dielectric layer 152, as a portion of the interlayer dielectric layer, may be used together with the first dielectric layer 151 to electrically isolate different semiconductor structures. In one embodiment, the second dielectric layer 152 may be made of silicon oxide. In another embodiment, the second dielectric layer may be made of silicon nitride, silicon oxynitride, or other suitable insulating material(s).

Forming the opening 143 may include: referring to FIG. 12, forming a contact hole 181 in the interlayer dielectric layer, where a bottom of the contact hole may expose the first stress layer 141; and referring to FIG. 13, back-etching the first stress layer 141 along the contact hole 181 to form the opening 143.

The contact hole 181 may expose the first stress layer 141, and provide a process operation space for the formation of the opening 143 and a subsequent second stress layer. In one embodiment, the contact hole 181 may also provide a process space for the subsequent formation of a plug. In one embodiment, the interlayer dielectric layer may include the first dielectric layer 151 and the second dielectric layer 152, thus, the contact hole 181 may penetrate through the first dielectric layer 151 and the second dielectric layer 152.

In one embodiment, the contact hole 181 may be formed by a dry etching process. The dry etching process may have strong anisotropic characteristics, effectively reduce the loss of the interlayer dielectric layer, and improve the quality of the contact hole 181.

In one embodiment, after forming the gate structure 160 and before forming the first dielectric layer 151, a contact etch stop layer (CESL) (not illustrated) may be formed. The contact etch stop layer may cover the base substrate 100, the first stress layer 141, and the gate structure 160. The contact etch stop layer may protect the first stress layer 141 and the gate structure 160 from adverse effects caused by the formation process of the contact hole 181. The contact etch stop layer may be made of silicon nitride.

Forming the contact hole 181 may include: forming the contact hole 181 to penetrate through the interlayer dielectric layer by a dry etching process, where the bottom of the contact hole 181 may expose the contact etch stop layer on the first stress layer 141; and removing the exposed contact etch stop layer to expose the first stress layer 141 at the bottom of the contact hole 181.

Referring to FIG. 13, the process of back-etching the first stress layer 141 may be used to remove a portion of the first stress layer 141, thereby the first stress layer 141 affected by the fabrication process of the gate structure 160 may be removed. Moreover, the process of back-etching the first stress layer 141 may form the opening 143 in the first stress layer 141, thereby providing a process space for the subsequent formation of a second stress layer.

Forming the opening 143 by performing the back-etching process through the contact hole 181 may reduce the process steps for forming the semiconductor structure, reduce the number of times of photolithography process, and avoid alignment issues of the fore and post lithography processes, thereby facilitating improving the performance and yield of the formed semiconductor structure.

In one embodiment, the first stress layer 141 may be back-etched through a dry etching process. That is, a portion of the first stress layer 141 exposed at the bottom of the contact hole 180 may be removed by a dry etching process along the contact hole 180 (illustrated in FIG. 12) to form the opening 143 in the first stress layer 141.

The opening 143 may be used to subsequently form the second stress layer, thus, the size of the opening 143 may be related to the size of the subsequently formed second stress layer. Therefore, a depth of the opening 143 cannot be too small or too large.

If the depth of the opening 143 is too large, the amount of the removed first stress layer 141 may be too large, thus, a volume of the second stress layer subsequently formed in the opening 143 may be substantially large, and a depth of the formed second stress layer may be too large. Therefore, a distance between the formed second stress layer and the channel of the formed semiconductor structure may be too small, causing the short-channel effect to be easily deteriorated, and an excessive leakage current issue may be likely to occur. If the depth of the opening 143 is too small, the amount of the removed first stress layer 141 may be too small, and the volume of the second stress layer subsequently formed in the opening 143 may be too small. Therefore, the effect of the formed second stress layer exerting stress on the channel of the formed semiconductor structure may not be effectively increased, the mobility of carriers in the channel may not be effectively improved, and the performance of the formed semiconductor structure may not be effectively improved.

In one embodiment, a ratio of the depth of the opening 143 over an entire thickness of the first stress layer 141 may be in a range of approximately 1/3-2/3. That is, in a direction perpendicular to the surface of the substrate 110, the ratio of the size of the opening 143 over the size of the first stress layer 141 may be in a range of approximately 1/3-2/3.

Process parameters of the back-etching process may be selected within a reasonable range. By controlling an etching time of the back-etching process, the thickness of the removed first stress layer 141 may be controlled, and, thus, the depth of the opening 143 may be controlled to enable the depth of the opening 143 to meet design requirements.

Figure 14:
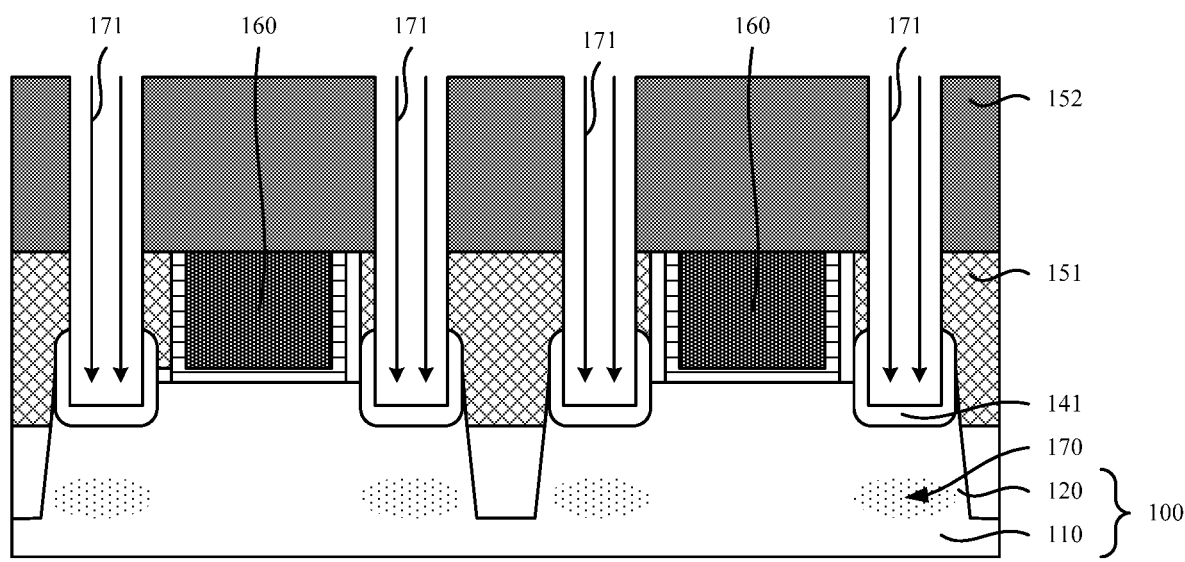

Returning to FIG. 18, after forming the opening in the first stress layer, an anti-leakage doped region may be formed (S109). FIG. 14 illustrates a corresponding semiconductor structure.

Referring to FIG. 14, in one embodiment, after forming the opening 143, an anti-leakage doped region 170 may be formed in the base substrate 100 under the first stress layer 141 by performing an anti-leakage implantation 171 along the opening 143 (illustrated in FIG. 13).

The anti-leakage implantation 171 may be used to implant dopant ions into the base substrate 100 under the first stress layer 141, thus, the anti-leakage doped region 170 may be formed. The anti-leakage doped region 170 may be used to suppress the leakage current of the formed semiconductor structure.

The anti-leakage implantation 171 may be performed along the opening 143 (illustrated in FIG. 13) to form the anti-leakage doped region 170 in the base substrate 100 under the first stress layer 141. Because the opening 143 is disposed within the first stress layer 141, by performing the anti-leakage implantation 171 along the opening 143, an energy of the anti-leakage implantation 171 may be effectively reduced, and the influence of the anti-leakage implantation 171 on other semiconductor structures may be reduced, facilitating improving the performance of the formed semiconductor structure.

In one embodiment, the base substrate 100 may include the substrate 110 and the fin 120, thus, the anti-leakage doped region 170 may be located in the fin 120 under the first stress layer 141. The openings 143 may be located at the bottom of the contact hole 181 (illustrated in FIG. 12), and may be through-connected to the contact hole 181. The contact hole 181 may penetrate through the first dielectric layer 151 and the second dielectric layer 152. Therefore, because the anti-leakage implantation 171 is performed along the contact hole 181 and the opening 143, the energy required for the anti-leakage implantation 171 may be effectively reduced, and the damages on the first stress layer 141 and the fin 120 caused by the anti-leakage implantation 171 may be reduced, thereby facilitating improving the performance of the formed semiconductor structure.

In one embodiment, when the semiconductor structure is used to form an NMOS device, process parameters of the anti-leakage implantation 171 may include the following. Implanted ions may be P ions, an implantation energy may be in a range of approximately 2 KeV-20 KeV, and an implantation dose may be in a range of approximately $2.0 \times 10^{14}$ atoms/cm$^3$-$5.0 \times 10^{15}$ atoms/cm$^3$.

In another embodiment, when the semiconductor structure is used to form a PMOS device, the process parameters of the anti-leakage implantation 171 may include the following. Implanted ions may be B ions or BF$_2$ ions, an implantation energy may be in a range of approximately 2 KeV-20 KeV, and an implantation dose may be in a range of approximately $2.0 \times 10^{13}$ atoms/cm$^3$-$3.0 \times 10^{15}$ atoms/cm$^3$.

Figure 15:
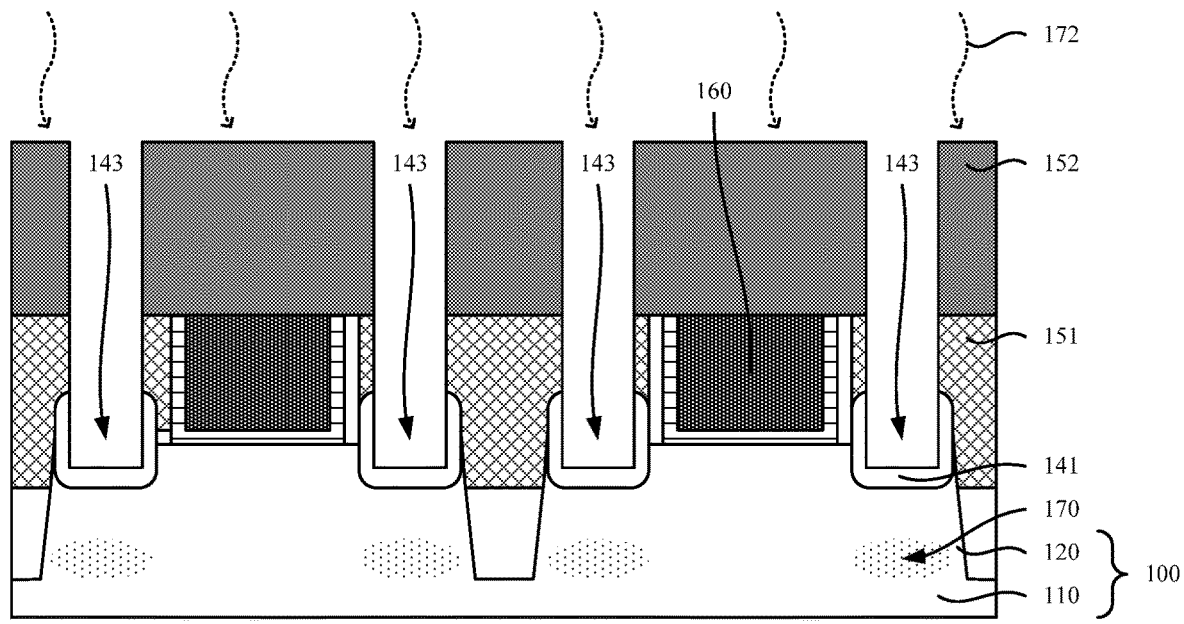

Returning to FIG. 18, after forming the anti-leakage doped region, an activation annealing may be performed (S110). FIG. 15 illustrates a corresponding semiconductor structure.

Referring to FIG. 15, after performing the anti-leakage implantation 171, an activation annealing 172 may be performed on the anti-leakage doped region 170. The activation annealing 172 may be used to enable the dopant ions to relax to positions of the lattices, and, thus, to be activated.

In one embodiment, the activation annealing 172 may be a spike annealing process at an annealing temperature in a range of approximately 950° C.-1050° C. In another embodiment, the activation annealing may be a laser annealing process at an annealing temperature in a range of approximately 1150° C.-1350° C. The annealing temperature of the activation annealing 172 cannot be too high nor too low.

If the annealing temperature of the activation annealing 172 is too high, the thermal budget may be too high and may cause adverse effects on the remaining first stress layer 141, thus, a stress-released issue of the remaining first stress layer 141 may be likely to occur, and the dopant ions in the first stress layer 141 may diffuse to cause the deterioration of the short-channel effect. If the annealing temperature of the activation annealing 172 is too low, the activation of the dopant ions in the anti-leakage doped region 170 may be affected, and, thus, the leakage current suppression function of the anti-leakage doped region 170 may be affected to degrade the performance of the formed semiconductor structure.

Figure 16:
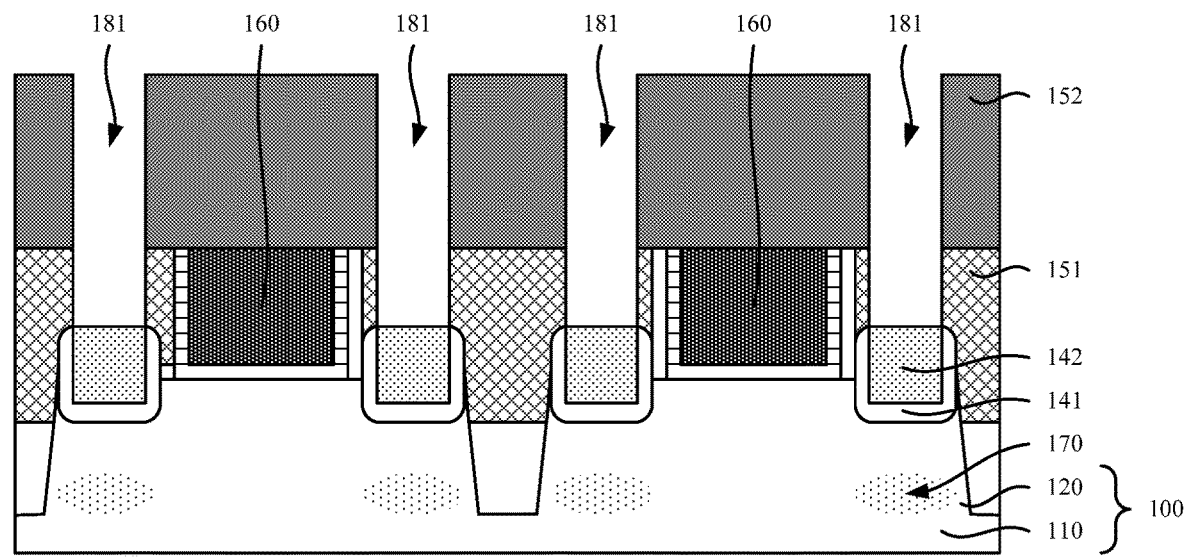

Returning to FIG. 18, after performing the activation annealing, a second stress layer may be formed (S111). FIG. 16 illustrates a corresponding semiconductor structure.

Referring to FIG. 16, a second stress layer 142 may be formed in the opening 143 (illustrated in FIG. 13). The second stress layer 142 may be used as a portion of the source and drain doped region of the formed semiconductor structure, and together with the first stress layer 141, may exert a stress to the channel of the formed semiconductor structure, to increase the carrier mobility in the channel.

The second stress layer 142 may be formed after forming the gate structure 160. The gate structure 160 may be a metal gate structure, and the formation process of the metal gate structure may include multiple thermal processes, such that the thermal budget of the formation process of the gate structure 160 may be large. Therefore, by forming the second stress layer 142 after forming the gate structure 160, the influence of the formation process of the gate structure 160 on the second stress layer 142 may be effectively reduced. In particular, the second stress layer 142 may not be affected by the thermal process during the formation of the gate structure 160, and the probability of the occurrence of the stress-released issue of the second stress layer 142 may be effectively reduced. Therefore, the performance of the source and drain doped region of the formed semiconductor structure may be improved, and the performance of the formed semiconductor structure may be improved.

In addition, in one embodiment, before forming the second stress layer 142, the anti-leakage doped region 170 may be formed and the activation annealing may be performed. Therefore, thermal budget of the second stress layer 142 may be effectively reduced, facilitating reducing the probability of the occurrence of the stress-released issue of the second stress layer 142, and improving the performance of the formed semiconductor structure.

In one embodiment, the formed semiconductor structure may be used to form an NMOS device, the second stress layer 142 may be made of carbon silicon for exerting tensile stress on the channel of the formed semiconductor structure. In one embodiment, the first stress layer 141 may be made of carbon silicon or silicon, and the content of carbon in the second stress layer 142 may be greater than or equal to the content of carbon in the first stress layer 141. The stress layer may exert stress on the channel of the formed semiconductor structure through a principle of lattice mismatch, because the content of carbon in the second stress layer 142 is higher, the second stress layer 142 may exert a greater stress on the channel of the formed semiconductor structure. Therefore, the mobility of carriers in the channel of the formed semiconductor structure may be effectively improved, thereby facilitating improving the performance of the formed semiconductor structure.

In one embodiment, the formed semiconductor structure may be used to form an NMOS device, the first stress layer 141 may be made of carbon silicon or silicon, and the second stress layer 142 may be made of carbon silicon. In another embodiment, when the formed semiconductor structure is used to form a PMOS device, the first stress layer may be made of silicon germanium or silicon, and the second stress layer may be made of silicon germanium. The second stress layer may be made of silicon germanium, and the content of germanium in the second stress layer may be greater than or equal to the content of germanium in the first stress layer. Therefore, the second stress layer may exert a greater stress on the channel of the formed semiconductor structure to improve the performance of the formed semiconductor structure.

The second stress layer 142 may be a doped stress layer, and a doping type of the second stress layer 142 may be the same as a doping type of the first stress layer 141. In one embodiment, the formed semiconductor structure may be used to form an NMOS device, and the first stress layer 141 may be an N-type doped stress layer, thus, the second stress layer 142 may be made of N-type doped carbon silicon or silicon. The dopant ions in the second stress layer 142 may be N-type ions, such as P, As, or Sb, etc.

In one embodiment, a doping concentration of the second stress layer 142 may be greater than or equal to a doping concentration of the first stress layer 141. Use of the second stress layer 142 having the doping concentration greater than or equal to the first stress layer 141 may effectively reduce a contact resistance between a subsequently formed plug and the second stress layer 142.

The second stress layer 142 may be located in the opening 143, and the opening 143 may be located in the first stress layer 141. That is, the second stress layer 142 may be located in the first stress layer 141. In other words, in a plane parallel to the surface of the substrate 110, the first stress layer 141 may surround the second stress layer 142. Therefore, a portion of the first stress layer 141 may be disposed between the channel of the formed semiconductor structure and the second stress layer 142, and the second stress layer 142 may be spaced a certain distance from the channel of the semiconductor structure. Therefore, the second stress layer 142 with a substantially large doping concentration may be prevented from causing a deterioration of the short-channel effect.

Therefore, under the premise of controlling the short-channel effect, the formation of the second stress layer 142 with a substantially large doping concentration may reduce the contact resistance between the plug and the second stress layer 142, facilitating improving the performance of the formed semiconductor structure.

In one embodiment, forming the second stress layer 142 may include forming the second stress layer 142 in the opening 143 by an epitaxial growth process, where an in-situ self-doping process may be performed during the epitaxial growth of the second stress layer 142.

In one embodiment, the formed semiconductor structure may be used to form an NMOS device, in-situ self-doped dopant ions may be P ions, and a doping concentration may be in a range of approximately $8.0 \times 10^{20}$ atoms/cm$^3$-$2.5 \times 10^{21}$ atoms/cm$^3$. In another embodiment, the formed semiconductor structure may be used to form a PMOS device, and the in-situ self-doped dopant ions may be B ions, and a doping concentration may be in a range of approximately $2.0 \times 10^{20}$ atoms/cm$^3$-$1.5 \times 10^{21}$ atoms/cm$^3$.

Returning to FIG. 18, after forming the second stress layer, a plug may be formed (S112). FIG. 17 illustrates a corresponding semiconductor structure.

Referring to FIG. 17, in one embodiment, after forming the second stress layer 142, a plug 180 may be formed in the contact hole 181 (illustrated in FIG. 16). The plug 180 may be used to electrically connect the source and drain doped region of the formed semiconductor structure to an external circuit.

In one embodiment, the plug 180 may be made of tungsten. In one embodiment, the source and drain doped region may include the first stress layer 141 and the second stress layer 142, and, thus, the plug 180 may be disposed on the second stress layer 142 and penetrate through the first dielectric layer 151 and the second dielectric layer 152 over the second stress layer 142.

In one embodiment, forming the plug 180 may include filling the contact hole 181 with a conductive material, where the conductive material may cover the second dielectric layer 152; and removing the conductive material above the second dielectric layer 152 to form the plug 180.

In the disclosed embodiments, the opening may be formed in the first stress layer, and the second stress layer may be formed in the opening. The first stress layer and the second stress layer may together form the source and drain doped region of the semiconductor structure. Forming the second stress layer after forming the gate structure may effectively reduce the influence of the formation process of the gate structure on the second stress layer and the probability of the occurrence of the stress-released issue of the second stress layer. Therefore, the performance of the source and drain doped region of the formed semiconductor structure may be improved, and the performance of the formed semiconductor structure may be improved.

The gate structure may be the metal gate structure. Before forming the first stress layer, the dummy gate structure may be formed on the base substrate. After forming the first stress layer and before forming the opening, the dummy gate structure may be removed, and the metal gate structure may be formed in the position where the dummy gate structure is previously located. Therefore, the opening and the second stress layer may be formed after forming the metal gate structure. The formation process of the opening may remove a portion of the first stress layer, thereby a portion of the first stress layer having a degraded performance may be removed. The second stress layer reformed in the opening may not be subject to the influence of the formation process of the metal gate structure, and, thus, may have desired performance. Therefore, the source and drain doped region formed by the second stress layer and the first stress layer may have desired performance, and may facilitate improving the performance of the formed semiconductor structure.

When the second stress layer is made of silicon germanium, the content of germanium in the second stress layer may be greater than or equal to the content of germanium in the first stress layer. When the second stress layer is made of silicon carbon, the content of carbon in the second stress layer may be greater than or equal to the content of carbon in the first stress layer. Accordingly, the second stress layer may exert a greater stress on the channel of the formed semiconductor structure. Therefore, the mobility of carriers in the channel of the semiconductor structure may be effectively improved, thereby facilitating improving the performance of the formed semiconductor structure.

The doping concentration of the second stress layer may be greater than or equal to the doping concentration of the first stress layer. Accordingly, the contact resistance between the plug and the second stress layer may be effectively reduced. The second stress layer may be disposed in the first stress layer. In other words, a portion of the first stress layer may be disposed between the channel of the semiconductor structure and the second stress layer, and the second stress layer may be spaced a certain distance from the channel of the semiconductor structure. Therefore, the second stress layer with a substantially large doping concentration may be prevented from causing a deterioration of the short-channel effect. Therefore, under the premise of controlling the short-channel effect, the formation of the second stress layer with a substantially large doping concentration may reduce the contact resistance between the plug and the second stress layer, facilitating improving the performance of the semiconductor structure.

After forming the opening and before forming the second stress layer, the anti-leakage doped region may be formed in the base substrate under the first stress layer by performing the anti-leakage implantation along the opening. Because the opening is disposed in the first stress layer, by performing the anti-leakage implantation along the opening, the energy of the anti-leakage implantation may be effectively reduced, and the influence of the anti-leakage implantation on other semiconductor structures may be reduced, facilitating improving the performance of the formed semiconductor structure. Further, the second stress layer may be formed after performing the anti-leakage implantation and the activation annealing, the thermal budget of the second stress layer may be effectively reduced, facilitating reducing the probability of the occurrence of the stress-released issue of the second stress layer, and improving the performance of the formed semiconductor structure.

The present disclosure also provides a semiconductor structure. FIG. 17 illustrates a cross-sectional view of an exemplary semiconductor structure consistent with various disclosed embodiments of the present disclosure. Referring to FIG. 17, the semiconductor structure may include a base substrate 100, a gate structure 160 on the base substrate 100, a first stress layer 141 in the base substrate 100 on both sides of the gate structure 160, and a second stress layer 142 in the first stress layer 141. The second stress layer 142 may be formed after forming the gate structure 160.

The second stress layer 142 may be located in the first stress layer 141. The first stress layer 141 together with the second stress layer 142 may form a source and drain doped region of the semiconductor structure. Because the second stress layer 142 is formed after forming the gate structure 162, the influence of the formation process of the gate structure 160 on the second stress layer 142 may be effectively reduced, and the probability of the occurrence of the stress-released issue of the second stress layer 142 may be effectively reduced. Therefore, the performance of the source and drain doped region of the formed semiconductor structure may be improved, and the performance of the formed semiconductor structure may be improved.

In one embodiment, the semiconductor structure may include a metal gate structure. That is, the gate structure 160 may be the metal gate structure. In one embodiment, the formed semiconductor structure may be used to form an NMOS device, thus, the first stress layer 141 may be an N-type doped stress layer. The first stress layer 141 may be made of N-type doped carbon silicon or silicon. The dopant ions in the first stress layer 141 may be N-type ions, such as P, As, or Sb, etc.

The second stress layer 142 may be used as a portion of the source and drain doped region of the formed semiconductor structure, and together with the first stress layer 141, may exert a stress to the channel of the formed semiconductor structure, to improve the carrier mobility in the channel.

The second stress layer 142 may be formed after forming the gate structure 160. The gate structure 160 may be the metal gate structure, and the formation process of the metal gate structure may include multiple thermal processes, such that the thermal budget of the formation process of the gate structure 160 may be large. Therefore, by forming the second stress layer 142 after forming the gate structure 160, the influence of the formation process of the gate structure 160 on the second stress layer 142 may be effectively reduced. In particular, the second stress layer 142 may not be affected by the thermal process during the formation of the gate structure 160, and the probability of the occurrence of the stress-released issue of the second stress layer 142 may be effectively reduced. Therefore, the performance of the source and drain doped region of the formed semiconductor structure may be improved, and the performance of the formed semiconductor structure may be improved.

In one embodiment, the semiconductor structure may be used to form an NMOS device, the second stress layer 142 may be made of carbon silicon for exerting tensile stress on the channel of the semiconductor structure. In one embodiment, the first stress layer 141 may be made of carbon silicon or silicon. The content of carbon in the second stress layer 142 may be greater than or equal to the content of carbon in the first stress layer 141. The stress layer may exert stress on the channel of the semiconductor structure through a principle of lattice mismatch, because the content of carbon in the second stress layer 142 is higher, the second stress layer 142 may exert a greater stress on the channel of the semiconductor structure. Therefore, the mobility of carriers in the channel of the semiconductor structure may be effectively improved, thereby facilitating improving the performance of the formed semiconductor structure.

In one embodiment, the semiconductor structure may be used to form an NMOS device, the first stress layer 141 may be made of carbon silicon or silicon, and the second stress layer 142 may be made of carbon silicon. In another embodiment, when the semiconductor structure is used to form a PMOS device, the first stress layer may be made of silicon germanium or silicon, and the second stress layer may be made of silicon germanium. The second stress layer may be made of silicon germanium, and the content of germanium in the second stress layer may be greater than or equal to the content of germanium in the first stress layer. Therefore, the second stress layer may exert a greater stress on the channel of the formed semiconductor structure to improve the performance of the semiconductor structure.

The second stress layer 142 may be a doped stress layer, and a doping type of the second stress layer 142 may be the same as a doping type of the first stress layer 141. In one embodiment, the semiconductor structure may be used to form an NMOS device, and the first stress layer 141 may be an N-type doped stress layer, thus, the second stress layer 142 may be made of N-type doped carbon silicon. The dopant ions in the second stress layer 142 may be N-type ions, such as P, As, or Sb, etc.

In one embodiment, a doping concentration of the second stress layer 142 may be greater than or equal to a doping concentration of the first stress layer 141. Use of the second stress layer 142 having a doping concentration greater than or equal to the first stress layer 141 may effectively reduce a contact resistance between a subsequently formed plug and the second stress layer 142.

The second stress layer 142 may be located in the first stress layer 141. In other words, in a plane parallel to the surface of the substrate 110, the first stress layer 141 may surround the second stress layer 142. Therefore, a portion of the first stress layer 141 may be disposed between the channel of the semiconductor structure and the second stress layer 142, and the second stress layer 142 may be spaced apart by a certain distance from the channel of the semiconductor structure. Therefore, the second stress layer 142 with a substantially large doping concentration may be prevented from causing a deterioration of the short-channel effect.

Therefore, under the premise of controlling the short-channel effect, the formation of the second stress layer 142 with a substantially large doping concentration may reduce the contact resistance between the plug and the second stress layer 142, facilitating improving the performance of the semiconductor structure.

In the disclosed embodiments, the semiconductor structure may be formed by the disclosed fabrication method of a semiconductor structure. Therefore, the detailed technical solution of the semiconductor structure may be referred to various embodiments of the present disclosure for forming a semiconductor structure, and is not repeated herein.

Accordingly, by forming the second stress layer after forming the gate structure may effectively reduce the influence of the formation process of the gate structure on the second stress layer, and may effectively reduce the probability of the occurrence of the stress-released issue of the second stress layer. Therefore, the performance of the source and drain doped region of the formed semiconductor structure may be improved, and the performance of the formed semiconductor structure may be improved. In the disclosed embodiments, by increasing the content of germanium or carbon in the second stress layer, the second stress layer may provide greater stress on the channel of the formed semiconductor structure, and the mobility of carriers in the channel of the formed semiconductor structure may be effectively improved, thereby facilitating improving the performance of the formed semiconductor structure. In addition, under the premise of controlling the short-channel effect, by increasing the doping concentration of the second stress layer, the contact resistance between the plug and the second stress layer may be reduced, facilitating improving the performance of the formed semiconductor structure. Further, the anti-leakage doped region formed in the base substrate under the first stress layer may effectively reduce the thermal budget of the second stress layer, facilitating reducing the probability of the occurrence of the stress-released issue of the second stress layer, and improving the performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a base substrate;
   forming a first stress layer in the base substrate;
   forming a gate structure on the base substrate, wherein the first stress layer in the base substrate is on both sides of the gate structure;
   after forming the gate structure, forming an opening in the first stress layer by back-etching the first stress layer;
   forming an anti-leakage doped region in the base substrate under the first stress layer by performing an anti-leakage implantation along the opening; and forming a second stress layer in the opening of the first stress layer.

2. The method according to claim 1, wherein:
the first stress layer is made of one of silicon carbon and silicon;
the second stress layer is made of silicon carbon; and
a content of carbon in the second stress layer is greater than or equal to a content of carbon in the first stress layer.

3. The method according to claim 1, wherein:
the semiconductor structure is a PMOS,
in-situ self-doped dopant ions are B ions, and
a doping concentration of the second stress layer is in a range of approximately $2.0 \times 10^{20}$ atoms/cm$^3$-$1.5 \times 10^{21}$ atoms/cm$^3$.

4. The method according to claim 1, wherein:
the semiconductor structure is an NMOS,
in-situ self-doped dopant ions are P ions, and
a doping concentration of the second stress layer is in a range of approximately $8.0 \times 10^{20}$ atoms/cm$^3$-$2.5 \times 10^{21}$ atoms/cm$^3$.

5. The method according to claim 1, wherein parameters of the anti-leakage implantation include:
when the semiconductor structure is an NMOS,
implanted ions including P ions,
an implantation energy in a range of approximately 2 KeV-20 KeV, and
an implantation dose in a range of approximately $2.0 \times 10^{14}$ atoms/cm$^3$-$5.0 \times 10^{15}$ atoms/cm$^3$.

6. The method according to claim 1, wherein parameters of the anti-leakage implantation include:
when the semiconductor structure is a PMOS,
implanted ions including one type of B ions and BF$_2$ ions,
an implantation energy in a range of approximately 2 KeV 20 KeV, and
an implantation dose in a range of approximately $2.0 \times 10^{13}$ atoms/cm$^3$-$3.0 \times 10^{15}$ atoms/cm$^3$.

7. The method according to claim 1, after performing the anti-leakage implantation and before forming the second stress layer, further including:
performing an activation annealing on the anti-leakage doped region, wherein the activation annealing includes one of a spike annealing process at an annealing temperature in a range of approximately 950° C.-1050° C., and a laser annealing process at an annealing temperature in a range of approximately 1150° C.-1350° C.

8. The method according to claim 1, wherein back-etching the first stress layer includes:
a dry etching method.

9. The method according to claim 1, wherein:
a ratio of a depth of the opening over a thickness of the first stress layer is in a range of approximately 1/3-2/3.

10. The method according to claim 1, wherein:
the gate structure is a metal gate structure, wherein after forming the base substrate and before back-etching the first stress layer, the metal gate structure is formed by:
forming a dummy gate structure on the base substrate,
before forming the metal gate structure, forming the first stress layer in the base substrate on both sides of the dummy gate structure,
forming an interlayer dielectric layer on the base substrate,
forming a gate opening in the interlayer dielectric layer by removing the dummy gate structure, and
forming the metal gate structure in the gate opening.

11. The method according to claim 1, wherein:
an interlayer dielectric layer is formed on the base substrate, wherein the opening is formed by:
forming a contact hole in the interlayer dielectric layer, wherein a bottom of the contact hole exposes the first stress layer, and
forming the opening by back-etching the first stress layer along the contact hole.

12. The method according to claim 11, further including:
forming a plug in the contact hole after forming the second stress layer, wherein the plug completely covers the top surface of the second stress layer.

13. The method according to claim 1, wherein:
the second stress layer is formed in the opening by an epitaxial growth process; and
an in-situ self-doping process is performed during the epitaxial growth of the second stress layer.

* * * * *